United States Patent [19]

Schutrum

[11] Patent Number: 4,560,991
[45] Date of Patent: Dec. 24, 1985

[54] ELECTROFORMED CHARGE ELECTRODE STRUCTURE FOR INK JET PRINTERS

[75] Inventor: Walter L. Schutrum, Kettering, Ohio

[73] Assignee: Eastman Kodak Company, Rochester, N.Y.

[21] Appl. No.: 696,682

[22] Filed: Jan. 31, 1985

Related U.S. Application Data

[63] Continuation-in-part of Ser. No. 517,608, Jul. 27, 1983, abandoned.

[51] Int. Cl.⁴ .......................... G01D 15/18; H01S 4/00
[52] U.S. Cl. .................................. 346/75; 29/592 R; 29/825; 29/834; 29/846
[58] Field of Search ............... 346/75; 29/592 R, 834, 29/835, 846, 841, 848, 865, 825

[56] References Cited

U.S. PATENT DOCUMENTS

| | | | |
|---|---|---|---|
| 3,373,437 | 3/1968 | Sweet et al. | 346/75 |
| 3,397,345 | 8/1968 | Dunlavey | 361/228 X |
| 3,404,221 | 10/1968 | Loughren | 358/75 |
| 3,586,907 | 6/1971 | Beam et al. | 317/3 |
| 3,604,980 | 9/1971 | Robertson | 317/3 |
| 3,618,858 | 11/1971 | Culp | 239/15 |
| 3,656,171 | 4/1972 | Robertson | 346/1.1 |
| 4,101,906 | 7/1978 | Dahlstrom et al. | 346/75 |
| 4,223,320 | 9/1980 | Paranjpe et al. | 346/75 |
| 4,223,321 | 9/1980 | Kenworthy | 346/75 |
| 4,347,522 | 8/1982 | Bahl et al. | 346/75 |
| 4,419,674 | 12/1983 | Bahl et al. | 346/75 |
| 4,458,256 | 7/1984 | Shirato et al. | 346/140 R |

OTHER PUBLICATIONS

U.S. patent application Ser. No. 348,476, filed Feb. 12, 1983 and entitled "Wire Wound Flat-Faced Charge Plate," (MDE 712 P2), now U.S. Pat. No. 4,419,674.

Primary Examiner—E. A. Goldberg
Assistant Examiner—Gerald E. Preston
Attorney, Agent, or Firm—Dana M. Schmidt

[57] ABSTRACT

A charge electrode structure for an ink jet printer comprises a plurality of electrodes and connecting circuit leads embedded into a molded dielectric substrate and anchored thereto by means of an embedded depth that exceeds the width of the electrodes at the surface of the substrate. The charge plate is formed by means of photolithographic, plating and molding techniques. Nickel electrodes and circuit leads are plated through a position defining pattern in a photoresistive covering onto a copper foil sheet to a height slightly exceeding the photoresistive covering to form retaining flanges. The photoresistive covering is then removed and the composite foil sheet/plating is bent toward the plating such that the electrodes extend at approximately a 90° angle relative to the remainder of the sheet. The bent composite is then placed into a mold and a dielectric substrate is formed to engage and surround the electrodes and circuit leads. After curing, the substrate with the embedded circuit leads and electrodes is removed from the mold, and it is placed in a copper etchant to remove the copper foil sheet thereby exposing the charge surface and the conducting circuit path surface of the molded charge plate substrate.

24 Claims, 19 Drawing Figures

FIG. 13
(COMPARATIVE EX.)

ELECTROFORMED CHARGE ELECTRODE STRUCTURE FOR INK JET PRINTERS

BACKGROUND OF THE INVENTION

The present invention relates generally to ink jet printing systems and, more particularly, to a molded charge electrode structure or charge plate and method of fabricating the charge plate for use in an ink jet printing system.

In ink jet printers, tiny ink drops are selectively deposited onto a medium, typically a moving web or sheet to form a printed image. The ink drops are formed from liquid filaments emerging from tiny openings in an orifice plate communicating with an ink reservoir containing pressurized electrically conductive ink. By mechanically stimulating the orifice plate, uniformly sized and spaced drops are forced to break off from the fluid filaments.

As each drop separates from its associated fluid filament, it is permitted to remain uncharged or is selectively charged to one or more charge levels by an associated charge electrode. The drops then pass through an electrical deflection field.

Printing is performed in a variety of ways. For example, charged drops can be deflected by the deflection field to a drop catcher and uncharged drops which are not deflected by the field continue past the catcher to form the printed images, for example, on a moving web of material. Alternatively, the uncharged drops may be caught with the charged drops being deflected to one or a variety of positions on the moving web dependent upon the charge level of the particular drop. In any event, the importance of the charge electrode structure to proper operation of an ink jet printer is clearly evident.

Typical prior art charge electrodes have been formed by coating electrically conductive material onto a nonconductive substrates. Many prior art charge electrodes have partially or wholly surrounded the corresponding ink jet stream and normally extend uniformly along the stream for a distance of at least several drop diameters. Due to the tendency of the ink drops to separate from the filaments at different points, the electric field produced by a charge electrode must be uniform along the length of the ink filaments so that drops are properly charged regardless of their exact point of separation.

Early patents to Loughren, U.S. Pat. No. 3,404,221 and to Sweet et al, U.S. Pat. No. 3,373,437, utilized cylindrically shaped tubular electrodes to completely surround the ink jet stream or U-shaped channel electrodes to partially surround the stream. Unfortunately, accurate placement of the tubes or channels into a support structure and electrical connection of such electrodes to a signal source are both difficult and time consuming. Such placement and connection problems increase as the spacing between electrodes is reduced in multiple jet systems, utilizing hundreds of individual streams of ink drops spaced within a few thousandths of an inch of one another. Also, as the spacing between adjacent electrodes is reduced, the tube or channel walls become extremely thin. Thin electrode walls reduce reliability and, at some point, preclude formation of such electrodes.

Various attempts have been made to reduce the difficulty and expense of forming charge electrodes. For example, Beam et al, U.S. Pat. No. 3,586,907, shows a charge ring plate wherein a series of holes have an electrically conductive coating surrounding each hole and extending along the walls to form the charge electrodes. Electrical lead lines are plated onto the surface of the charge plate and extend each charge ring to a connection point. The techniques involved in plating the walls of the holes to obtain a continuous and uniform coating are complex and involve plating in several dimensions. Similarly, coating the U-shaped channel shown in Culp, U.S. Pat. No. 3,618,858, with an electrically conductive material also involves plating in several dimensions.

Robertson, U.S. Pat. Nos. 3,604,980 and 3,656,171, disclose charge electrodes formed by a series of strips of electrically conductive material plated onto a dielectric planar surface with each strip connected to a charging signal source.

Kenworthy, U.S. Pat. No. 4,223,321, discloses a planar charge plate wherein grooves are cut into the edge of a nonconductive substrate with the grooves and lands being metalized and printed circuit leads formed leading from the grooves. The grooves are then filled with an electrically conductive material, such as solder, and the front face of the structure is lapped to remove excess solder and metal plating from the lands to form the charge plate.

The charge electrodes of Robertson and Kenworthy differ from other prior art charge electrodes in that they do not surround or partially surround the drop streams. However, the formation of Robertson's conductive strips still requires plating in several dimensions and Kenworthy requires accurate machining initially to form the grooves in the substrate.

Bahl and Schutrum, U.S. Pat. No. 4,347,522, discloses a method of forming charge electrodes by laminating a plurality of thin sheets of electrically conductive material to construct essentially any form of electrode.

Another example of forming charge electrodes is disclosed by Bahl et al in U.S. patent application Ser. No. 348,476, filed on Feb. 12, 1982, now U.S. Pat. No. 4,419,674. In this application, wires are wrapped around a nonconductive charge plate support structure, preferably having wire locating notches formed into opposite end faces. The wire is then potted up to adhere it to the structure and the wire along one end face is exposed to form individual charge electrodes. The wire along the adjacent face is left embedded, except at its very end, so as to secure the wire to the structure.

While charge electrodes manufactured in accordance with the teachings of a variety of the prior art provide satisfactory operation of ink jet printers and have typically provided somewhat reduced costs as the art has advanced, more simplified methods for producing reliable charge electrode structures at still further reduced costs are always needed and desirable for advances and improvements in the ink jet art.

SUMMARY OF THE INVENTION

The invention provides a novel molded ink drop charge electrode structure or charge plate and a method of fabricating such a charge plate for use in an ink jet printer. The charge plate comprises a dielectric substrate having a plurality of regularly spaced electrodes embedded into a first surface or charge face of the substrate and a plurality of electrically conducting circuit leads terminating in connection points embedded into a second surface of the substrate with the circuit leads being electrically connected to the electrodes for convenient connection of the electrodes to a source of charging potential.

The electrodes and circuit leads preferably include retaining means to anchor the electrodes and circuit leads into the dielectric substrate. Part of the retention of the electrodes and circuit leads arises from the fact the depth of the plated electrodes and circuit leads exceeds the width of the individual parts measured at the surfaces of the electrode structure. In the preferred embodiment, the retaining means also include expansions of the electrodes and circuit leads to form retaining flanges which, when viewed from the end, resemble the caps of mushrooms or the heads of nails. The retaining flanges securely engage the dielectric substrate to prevent withdrawal of the embedded electrodes and circuit leads from the substrate.

Preferably, the dielectric substrate comprises an epoxy resin or other dielectric material which may be readily molded to completely surround the electrodes and circuit leads including the generally parallel sidewalls as well as the retaining flanges of the electrodes and circuit leads. To reduce the volume of epoxy resin required to form a given substrate, sheet means, for example, a perforated sheet of fiberglass epoxy board may be placed over the electrodes prior to molding the substrate. A reduction of the required volume of epoxy resin reduces shrinkage of the epoxy resin during curing. Further, the sheet of fiberglass epoxy board can be covered with a conductive material or replaced by a perforated sheet of stainless steel either of which are connected to a selected potential to reduce signal interference or cross-talk between the electrodes and circuit leads.

The charge plate structure of the present invention provides a rugged, high reliability charge plate having high dimensional accuracy and excellent electrical charcteristics. It is relatively inexpensive and readily fabricated in accordance with the method of the present invention by means of highly accurate photolithographic, plating and molding techniques without any requirement for high precision machining operations.

In a method of fabricating a charge plate in accordance with the present invention, a pattern defining electrode and associated connecting circuit path positions is formed onto a substantially planar foil sheet with the remainder of the sheet being protected by a covering which is resistant to plating opertions. Preferably, the foil sheet is copper and the pattern is formed by initially laminating a photoresistive film covering to the foil sheet, exposing the photoresistive covering to actinic light through a photomask to define the electrode and circuit path pattern and removing the portion of the covering corresponding to the pattern to expose the surface of the copper foil thereunder.

The exposed pattern is then plated with an electrically conducting material, preferably nickel, to form electrodes and the associated connecting circuit leads. The electrodes and associated circuit leads are preferably formed to a thickness which exceeds the thickness of the photoresistive covering. By plating to a thickness beyond that of the photoresistive covering, the plated material extends above and expands over the upper surface of the covering to form retaining flanges on each of the electrodes and circuit leads. The plating operation is limited such that no two of the flanges interconnect with one another. The remainder of the photoresistive covering is then thoroughly removed from the foil sheet such that the electrodes and the connecting circuit leads with their retaining flanges extend above the surface of the foil sheet.

The foil sheet is then bent toward the plated material with at least a portion of the electrodes being bent and angularly oriented, at approximately a 90° angle, relative to the circuit leads. The bent portion of the foil sheet including at least a portion of the electrodes will define the charge face of the finally formed charge plate.

A dielectric substrate is then formed to surround the plated material including the retaining flanges. The substrate is formed to have two surfaces covered by said foil sheet which is then removed to expose the plated material electrodes and circuit leads embedded within the substrate and preferably anchored thereto by means of retaining flanges.

Preferably, the bent foil sheet is clamped into a mold with the portion of the sheet including the connecting circuit leads being clamped to the mold as well as the bent portion of the sheet to ensure flatness of those portions of the substrate after formation. The dielectric substrate is then formed by inserting molding material, such as an epoxy resin, into the mold and curing the molding material to form the dielectric substrate.

A perforated sheet of fiberglass epoxy board can be inserted into the mold to displace some of the epoxy resin and thereby reduce shrinkage of the epoxy resins during curing. The fiberglass sheet may be covered with an electrically conductive coating which is connected to a selected potential, typically ground, to reduce potential interference or cross-talk between signals on the electrodes and circuit leads. Alternately, the fiberglass sheet can be replaced by a perforated sheet of stainless steel which is connected to a selected potential to both reduce required epoxy volume and reduce interference. Either fiberglass epoxy sheets or stainless steel sheets also serve to strengthen the substrate and, hence, the charge plate of the present invention.

It is, therefore, an object of the present invention to provide a molded charge plate wherein the electrodes and connecting circuit leads are embedded within a dielectric substrate with the electrodes and circuit leads being anchored into the substrate by means of retaining flanges formed at their innermost ends with the molded charge plate being advantageously fabricated by means of highly accurate and easily performed photographic, plating and molding operations.

Other objects and advantages of the invention will be apparent from the following description, the accompanying drawings and the appended claims.

DETAILED DESCRIPTION OF THE INVENTION

The present invention will now be described by initially describing the method of fabrication of the molded charge electrode structure. After the method of fabrication is fully understood, the novel structure of the molded charge plate will be more clear.

Figures 1, 2, 2A:
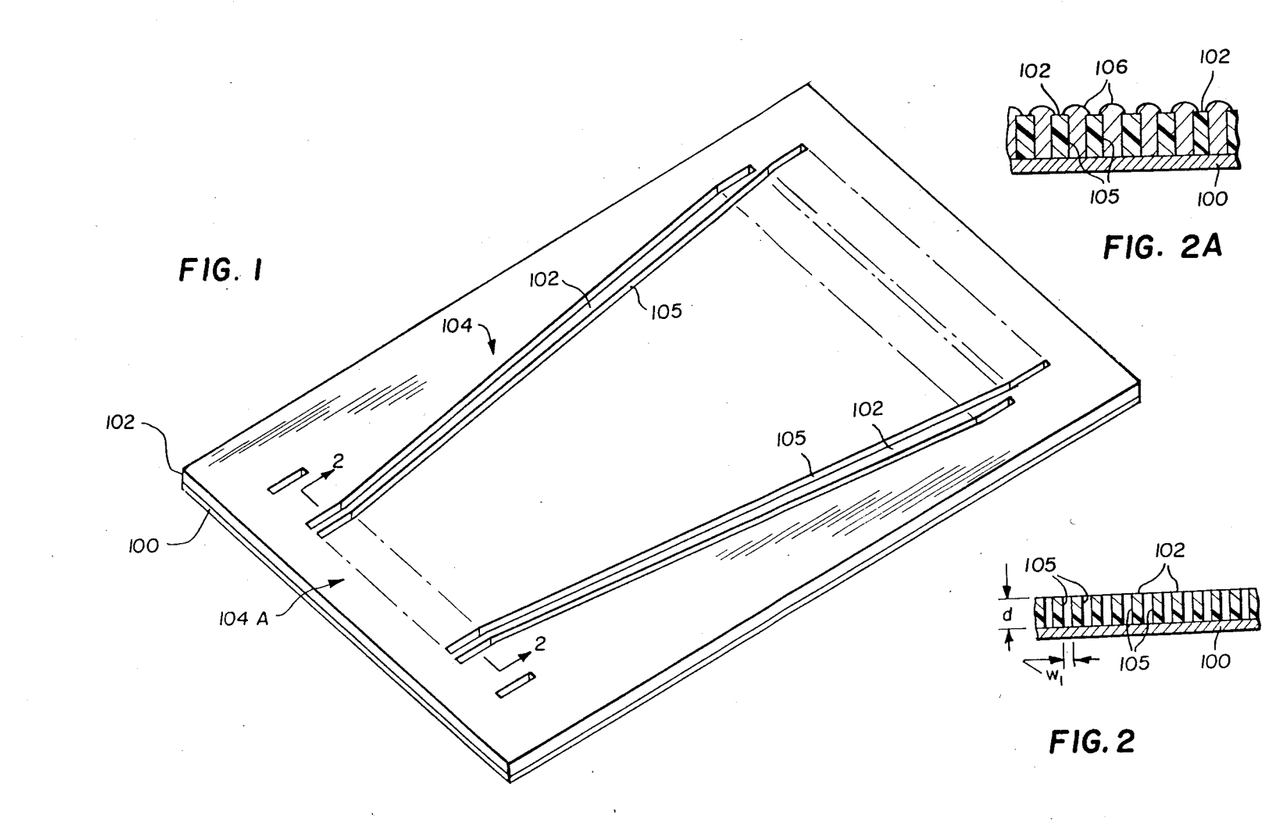
FIG. 1 is a perspective view of a patterned foil sheet ready to be plated.
FIG. 2 is a cross-section through the electrode portion of the pattern shown on FIG. 1 along the section line 2—2.
FIG. 2A illustrates the cross-section of FIG. 2 immediately after electrodes have been plated thereon.

FIG. 1 shows a foil sheet 100 with a photoresistive covering 102 on its upper surface. One fabrication of an operable charge plate in accordance with the present invention, utilizes electrodeposited (ED) copper foil having a thickness of about 36 μm (0.0014 inches) which is laminated with one layer of photopolymer film resist commercially available from DuPont as Type 218R, to form a photosensitive covering about 46 μm (0.0018 inches) thick. The photoresistive material was then selectively exposed through a photomask to actinic light (ultraviolet light of a wavelength of 300 to 400 nanometers for the identified photoresistive material.)

For the identified photoresistive material, the photomask is in the positive mode which prevents light from striking the electrode and conducting path pattern 104 shown in FIG. 1. Photoresistive material exposed to the actinic light is polymerized. After exposure, an aqueous alkaline solution is utilized to develop or wash away the nonpolymerized areas of the covering corresponding to the electrode and connecting circuit path pattern 104. The pattern 104 thus prepared defines the locations or positions for the formation of electrodes and connecting circuit leads on the foil sheet 100.

It should be noted that a variety of foils and foil thicknesses may be combined with various thicknesses of a variety of photoresistive materials and processed in accordance with well known techniques to form a patterned foil sheet as shown in FIG. 1. In particular, the depth of the photoresistive covering determines the embedded depth of the electrodes and circuit leads as will become clear. While such well-known materials and techniques will not be further described herein, it should be noted that any combination of these known technique and materials may be utilized in the present invention.

FIG. 2 shows a sectional view taken through the electrode portion 104A of the pattern 104 showing that the photoresistive material 102 corresponding to the pattern 104 has been removed down to the copper foil 100. The remaining areas of the polymerized photoresistive covering 102, as shown in FIG. 2, serve as a resistant barrier to plating operations which are utilized to form the electrodes and connecting circuit leads of the molded charge electrode structure on the foil sheet 100. As is apparent from the dimensions of FIG. 2, the depth d of the developed pattern preferably exceeds the width $w_1$ of the grooves formed in the resist.

The patterned laminated foil sheet of FIG. 1 is preferably placed into a plating bath, although any appropriate plating technique can be employed in accordance with the present invention. In the plating bath, an electrically conducting material, preferably nickel, is plated to the foil sheet 100 through the openings in the photoresistive material 102 which define the pattern 104. The plating operation is controlled such that the thickness (or depth) of the plating exceeds the thickness of the photoresistive material 102, preferably by approximately 5 μm (0.0002 inches). For example, the current density and plating time is controlled for electrolytic plating.

As the plating material extends above the parallel sidewalls 105 of the photoresistive material 102 defining the pattern 104 (see FIG. 2A), the plating material overplates the photoresistive material to spread beyond the limitations defined by the sidewalls 105 and thereby form retaining flanges 106. The retaining flanges 106 appear in cross-section as the heads of nails or the tops of mushrooms. The plating operation is limited such that the retaining flanges 106 formed on the upward ends of the plated material electrodes and connecting circuit leads extend beyond the sidewalls 105 but not to such an extent that they contact adjacent retaining flanges.

Figures 3, 4:
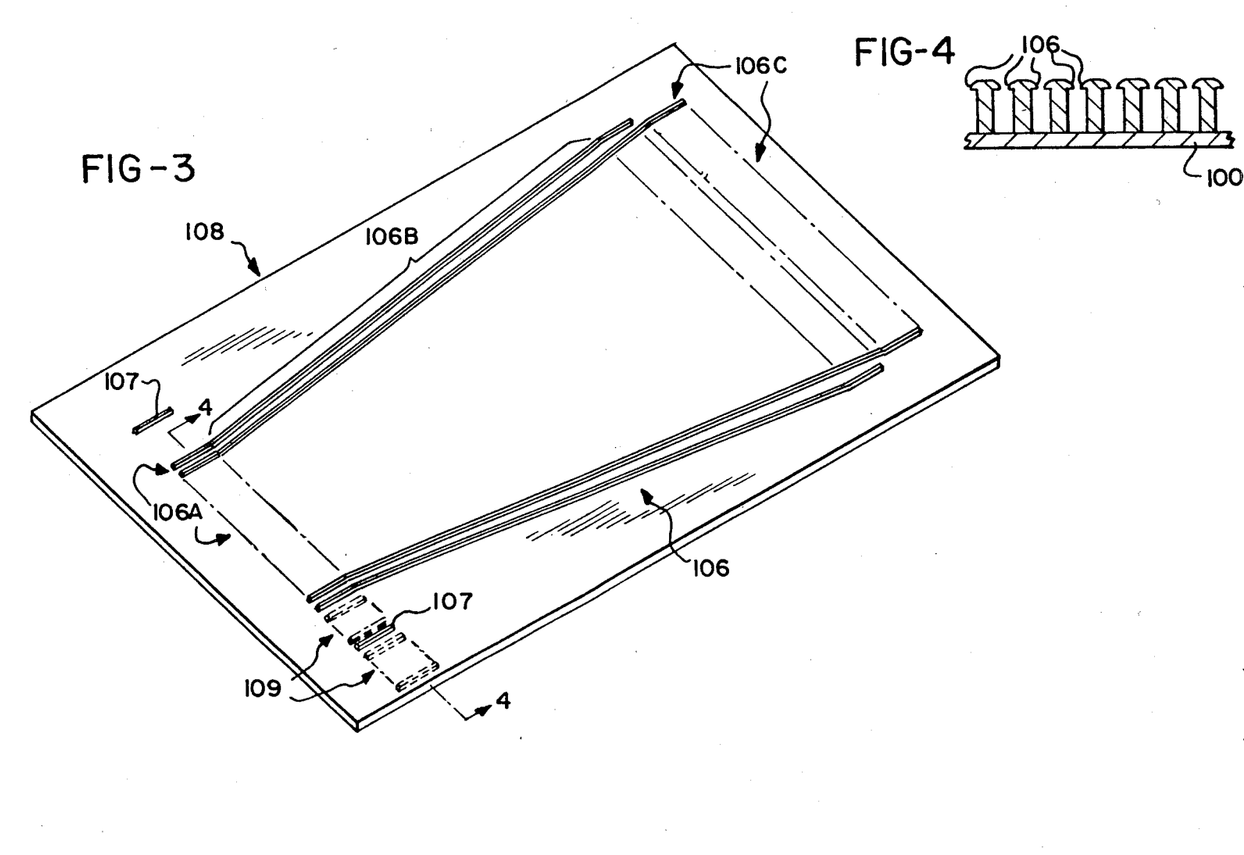
FIG. 3 is a perspective view of a foil sheet having plate electrodes and connecting circuit leads formed thereon.
FIG. 4 is a cross-sectional view through the plated electrodes and foil sheet of FIG. 3 along the section line 4—4.

The remaining polymerized photoresistive material is next removed by any appropriate stripper solution, for example, a mixture of dimethyl chloride and 3% methyl alcohol. The cleaning procedure must be thoroughly performed to ensure removal of the photoresist from beneath the edges of the retaining flanges 106 such that the electrodes and connecting circuit leads cleanly extend above the foil sheet 100 as shown in FIG. 4. Cleaning results in a composite foil sheet/plating 108 comprising the foil sheet 100 with plated electrodes and connecting circuit leads 106 electroformed in the positions defined by the pattern 104 and extending above the surface of the foil sheet 100 as shown in FIG. 3. One or more alignment pins 107 can also be formed by means of the plating operation to facilitate alignment of the molded charge plate of the present invention with an associated ink jet printing head.

Figures 5, 10, 11:
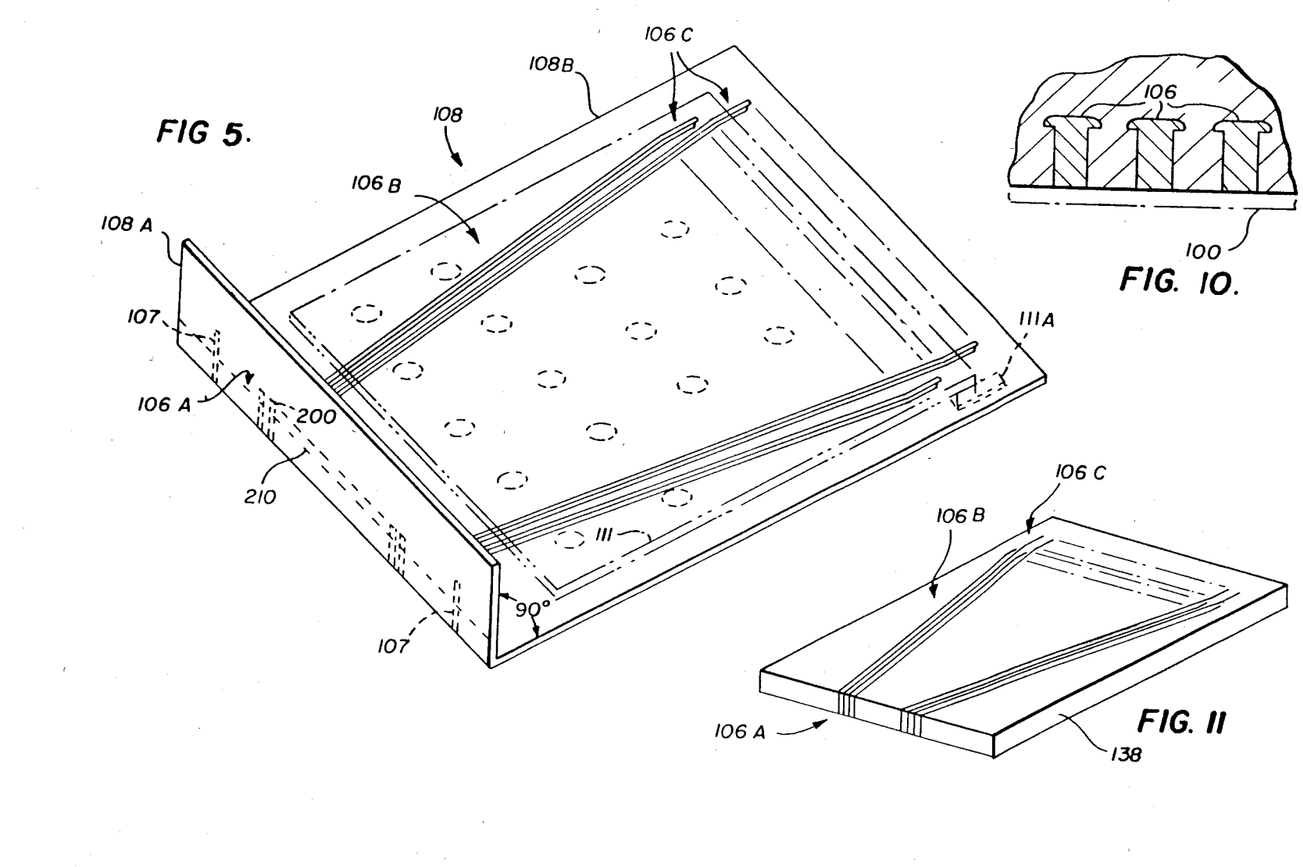
FIG. 5 shows the composite foil sheet/plating of FIG. 3 having the electrode end bent toward the plated material.
FIG. 10 is the same as FIG. 9, except the foil sheet has been removed to expose the electrodes or circuit leads and intervening surface areas of the dielectric substrate.
FIG. 11 is a perspective view of a molded charge electrode structure having embedded and anchored electrodes and connecting circuit leads in accordance with the present invention (compare with FIG. 3)
Figure 6:
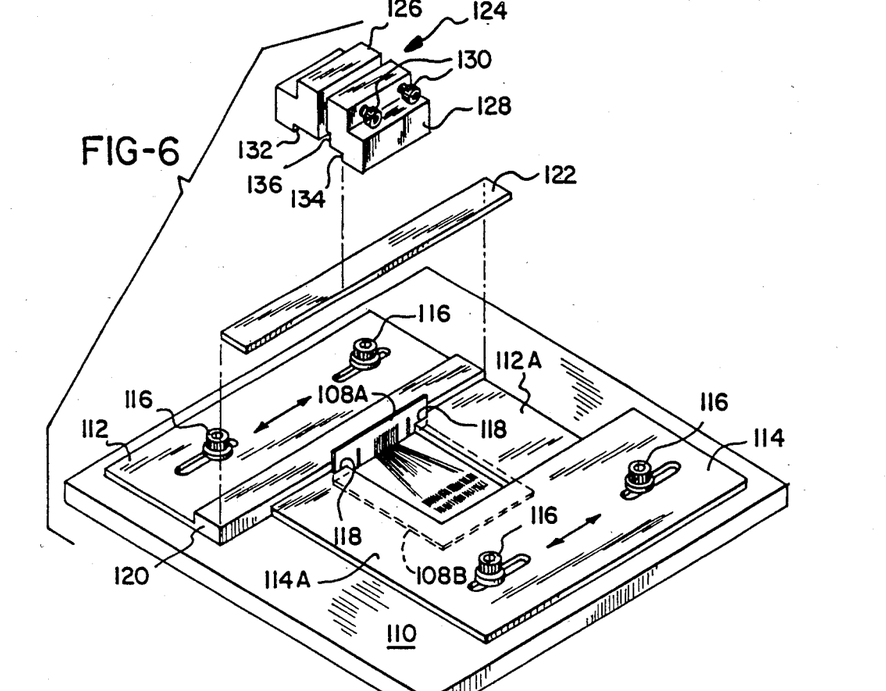
FIG. 6 is a perspective view of an illustrative mold including the bent composite of FIG. 5 together with a clamp arrangement for clamping the bent portion of the composite to a sidewall of the mold.

The composite foil sheet/plating 108 shown in FIG. 3 is then bent in a conventional manner toward the plated material electrodes and circuit leads to form an upwardly extending portion 108A and a horizontal portion 108B, FIG. 5. For example, a bending die engages the plated side of the composite and bends the composite by forcing it into a resilient backing pad which engages the unplated side of the composite. The bend is formed such that an inside corner is formed in the plated material and an outside corner is formed in the foil. At least a portion of the electrodes 106A are oriented at approximately 90°, 89° being preferred, relative to the remainder of the foil sheet containing the conducting circuit leads 106B. The bent composite 108 as shown in FIG. 5 is then placed into a mold, an illustrative embodiment of which is shown in FIG. 6.

Alternatively, the bending step just described can be done prior to the stripping of the resist from the plated intermediate.

Substantially evenly spaced "dummy" electrodes may be formed across the entire width of the foil sheet 100 as suggested by the dotted line electrodes 109 as shown in FIG. 3. Such dummy electrodes appear much the same as the alignment pins 107 but are spaced approximately the same as the electrodes 106A and extend from the outermost ones of the electrodes 106A substantially to the edges of the foil sheet 100. The formation of dummy electrodes provides a substantially uniform thickness for the composite foil sheet/plating 108 in the area to be bent and, hence, tends to enhance the yield of charge plates formed in accordance with the present invention. Other dummy electrodes, not shown, can also be extended or placed in the otherwise empty area of foil 108, between dummy electrodes 109 and circuit leads 106B, for the same purpose, that is, of re-enforcing foil 108 during the bending and resin-casting operation.

Sheet means, for example, a perforated sheet of fiberglass epoxy board 111, can be inserted into the mold over the conducting circuit leads 106B and connecting points 106C as shown in phantom in FIG. 5. The board 111 displaces some of the epoxy to thereby reduce shrinkage of the epoxy during curing. By drilling holes of different sizes in board 111, the amount of epoxy shinkage can be adjusted even further. The board 111 can be covered with an electrically conductive coating which in turn is connected to a selected potential, typically ground potential, via an otherwise isolated connecting point 111A. The grounded conducting covering reduces potential interference or cross-talk between the signals on the electrodes and connecting circuit leads.

Alternately, a perforated sheet of stainless steel, insulated from the circuit leads 106B and connecting points 106C can be used for epoxy displacement. The stainless steel sheet can also be utilized to reduce interference or cross-talk by being connected to ground in a manner similar to that of the conductive coating on the fiberglass board as described above. Of course, a fiberglass, stainless steel or other appropriate epoxy displacement sheet also serves to strengthen the substrate and, hence, the charge plate of the present invention.

The mold as shown in FIG. 6 comprises a base plate 110 to which two mold forming, generally L-shaped members 112 and 114 are adjustably secured by bolts 116 to form a variety of mold sizes. While any suitable mold can be utilized in accordance with the present invention, the mold shown in FIG. 6 provides for clamping the horizontal portion 108B of the foil sheet 100 including the connecting paths 106B to the base plate 110 of the mold by initially moving the mold forming members 112 and 114 to their extreme extended positions and inserting the edges of the composite foil sheet/plating 108 under short extensions 112A and 114A of the L-shaped members 112 and 114. Slots 118 are formed in the short extensions 112A and 114A to accommodate the bent upwardly extending portion 108A of the foil sheet/plating composite 108. The slots 118 are not required if the upwardly extending portion 108A is initially clamped to the mold. Such initial clamping may be performed by alternate mold and/or clamp embodiments as will be apparent to one skilled in the art.

Figure 7:
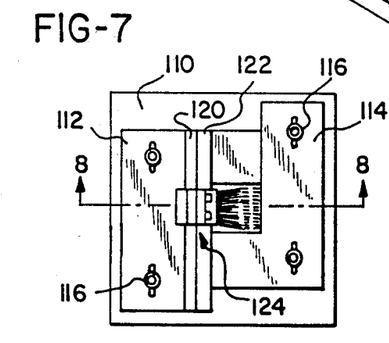
FIG. 7 is a plan view of the mold of FIG. 6 with the clamp arrangement secured to the mold.
Figure 8:
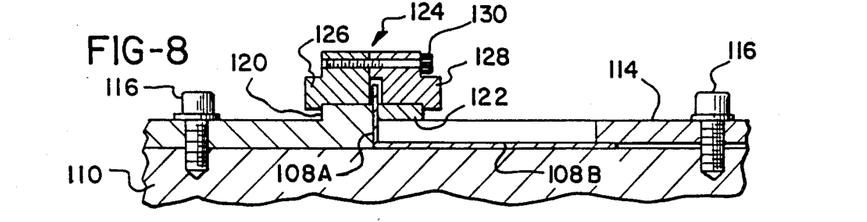
FIG. 8 is a cross-sectional view through the mold of FIG. 6 along the section line 8—8.

An upward extension 120 on the L-shaped member 112 provides for clamping the bent upwardly extending portion 108A of the composite 108 to ensure flatness of the substrate face into which the electrodes 106A will be embedded. A generally flat bar 122 is positioned upon the upper surface of the short extensions 112A and 114A of the L-shaped members 112 and 114 and is clamped to secure the bent upwardly extending portion 108A of the composite 108 against the upward extension 120 of the member 112. An illustrative clamp 124 is shown in FIGS. 6, 7 and 8 although any form of clamp can be provided to maintain clamping pressure on the bar 122 or to substitute for the clamp 124 and the clamping bar 122.

The clamp 124 comprises first and second clamp members 126 and 128 which are secured to one another for clamping by bolts 130. The first clamp member 126 has a notch 132 for engaging the extension 120 and the second clamp member 128 has a notch 134 for engaging the bar 122. The second clamp member 128 also has a second notch 136 into which the bent upwardly extending portion 108A of the composite 108 can extend during the substrate molding operation.

A limited clamping pressure is desirable to prevent deformation of the clamped plating. It is noted, however, that the plating may be limited such that it does not extend to the portion of the foil sheet which is clamped. Further, any deformation may be trimmed away together with excess portions of the foil sheet after substrate molding.

Once the bent composite 108 is positioned and clamped within the mold, a casting resin is injected into the mold to form a dielectric substrate 138 (see FIG. 11) for the molded charge electrode structure. The casting resin should have a relatively low viscosity, exhibit little shrinkage upon curing, be relatively strong and physically stable.

One casting resin which has been found suitable is an epoxy resin comprising Bisphenol A and Epichlorohydrin which is sold by Emerson & Cuming, Inc. of Northbrook, Illinois, under the name STYCAST 2850FT. This resin is mixed by weight in a ratio of about 100 parts STYCAST 2850FT resin with 4 to 5 parts of a modified aliphatic amine catalyst such as is identified by Emerson & Cuming, Inc. as CATALYST 11. Standard molding practices, release agents and air evacuation using vacuum are recommended for the molding process, all of which are well known in the art and will not be described in detail herein. The filled mold is then cured in a 100° C. oven for approximately 2 hours.

After curing, the mold is taken apart, excess foil is trimmed away and the entire molded piece is immersed in a conventional etchant to remove the foil but not adversely effect the plating material or the substrate.

Figure 9:
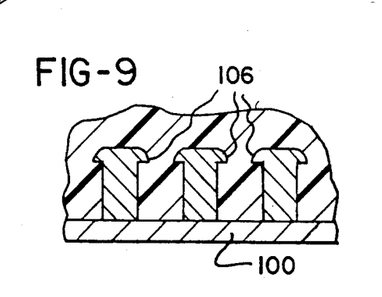
FIG. 9 is a fragmentary sectional view of a small portion of a foil sheet and three electrodes or circuit leads embedded within a dielectric substrate.

Fragmentary sectional views of a small portion of the foil sheet 100 and three electrodes or circuit leads with three associated retaining flanges 106 embedded into the dielectric substrate 138 are shown before and after removal in FIGS. 9 and 10, respectively.

Figure 12:
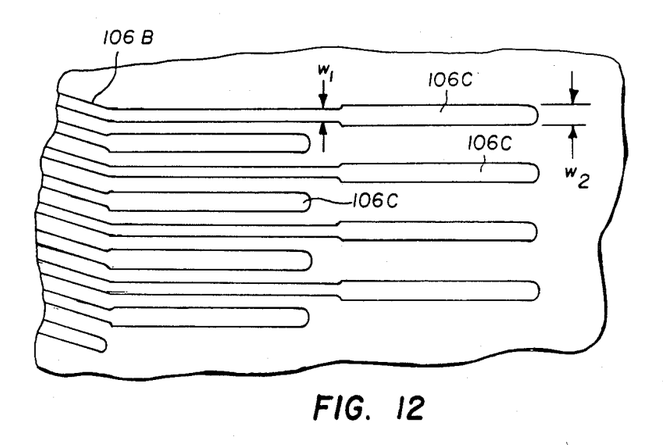
FIG. 12 is a fragmentary enlarged plan view of a portion of an alternate embodiment of the circuit leads 106A of FIG. 11.

Connecting points 106C can have the same thickness as the rest of circuit leads 106B, as shown, or alternatively they can have increased widths, FIG. 12. That is, $w_2$ can be up to four times the width of $w_1$, the width of paths 106C, e.g., 200 μm instead of 50 μm. Such increased width allows a more ready bonding of the electrode structure to the rest of the ink jet printer wiring. More specifically, such bonding can be accomplished with such greater widths by automatic bonding techniques.

The molded piece is then finished on the poured surface by conventional methods, or alternatively, the mold may include an upper surface such that no further finishing is required. For example, the clamping bar 122 can be widened to extend over substantially the entire length of the mold cavity. It is to be understood that any molding process which will result in a dielectric substrate in which the electrodes and circuit leads and their retaining flanges are embedded may be utilized in accordance with the present invention.

Because the very ends 200 of the electrodes, FIG. 5, represent high flux sites during the electroplating, there is a tendency, recognized in the art, to overplate at such ends. As will be readily apparent, this can be avoided by carefully controlling the nickel electroplating process so that it is stopped before the ends overplate to the point of contacting and shorting out each other, FIG. 13. There is a window of about 30 sec when the plating has to be stopped. Alternatively, the ends can be allowed to so overplate as to short out, provided they are trimmed along line 210, FIG. 5, before or after the potting operation of FIGS. 6–8, which removes those portions of the electrodes that are shorted together.

A more preferred process is one which avoids both the need for careful timing of the plating and the need for trimming. Parts similar to those previously described bear the same reference numeral, to which the distinguishing suffix x has been added. Thus, the process of FIG. 1 is modified so that, as shown in FIG. 14, the resist exposes electrodes 104x with tapered ends 200x. The amount of tapering is not critical, so long as it is sufficient to prevent extra plating at those ends such as causes shorting with the next adjacent electrode. An additional aspect of the high-flux phenomenon is that, as the current amperage increases, the amount of taper increases. That is, as already mentioned, it is well known that the flux of the electroplating field is drastically increased at ends 200x, to the point that more electroplating occurs there than anywhere else. By tapering ends 200x so that $w_4$ is reduced, compared to $w_3$, over length 1, FIG. 15, the electroplating at ends 200x will proceed at the same rate as everywhere else along the length 104x, thereby producing retaining flanges 106x, FIG. 16, that are of uniform width omega along the entire length of the electrode, even at ends 200x, FIG. 17. As a result, shorting together does not occur at such ends, even when the plating process is not carefully timed.

A useful example of such tapering is $w_3 = 48$ μm, $w_4 = 23$ μm and $1 = 965$ μm. In such a case, angle alpha, FIG. 15, $= 90° - \beta$, where $\tan \beta = (48-23)/2 \cdot 965$. Or, alpha $= 89.255°$. A 50% increase in the current amperage could require, e.g., a taper producing an angle $\alpha$ of 89.0°. In any case, some taper is preferred in order to insure that the width omega, FIG. 17, of the flanges either remains constant over length 1, or is decreasing, to prevent the shorting together of the electrodes.

Figure 17:
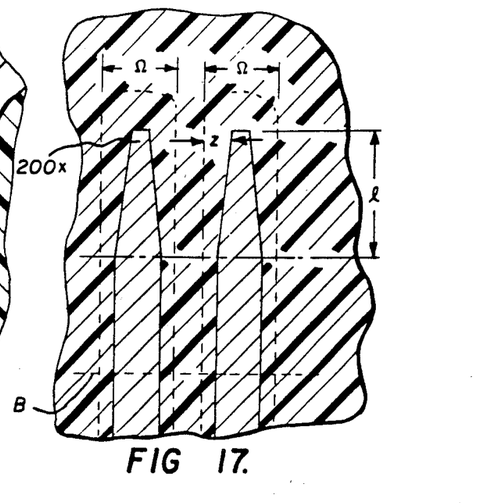
FIG. 17 is a section view taken generally along the line XVII—XVII of FIG. 16.

The fabrication sequence proceeds approximately as in the case of the previously described embodiment. That is, FIG. 16, the nickel is plated through the photoresist to form retaining flanges 106x that give the "nailhead" configuration. (As in other views, the parts are not to scale.) As shown in FIG. 17, this particularly occurs even at ends 200x, producing flanges that have a greater protrusion z than elsewhere. The photoresist is then stripped, not shown, and the plated electrodes and circuit leads, and the copper foil are bent about line B, FIG. 17, as in the previous embodiment, and potted with casting resin in the mold shown in FIG. 6. Unlike the previous embodiment, it is no longer preferred that the ends 200x project substantially above the mold, since there will be no material to trim off to remove shorted-together electrodes. Thus, the molding operation is simplified.

Figure 18:
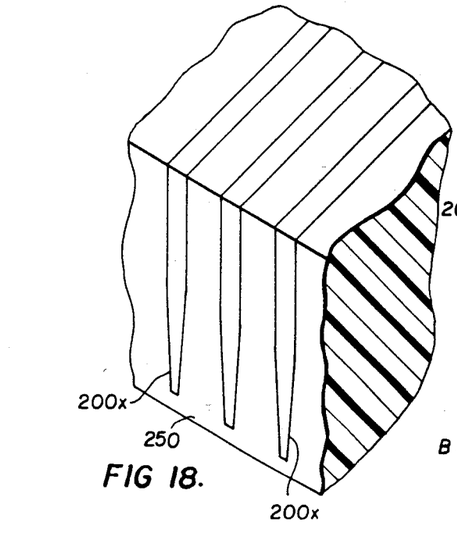
FIG. 18 is a fragmentary perspective view similar to FIG. 11, but of the results produced by the embodiment of FIG. 1.

After the potting operation, the finished structure appears as shown in FIG. 18, wherein the copper foil sheet 100x has been etched away. The taper of the electrodes is evident, as is the additional insulative casting resin (portion 250) that separates ends 200x from the next adjacent parts of the printer (usually the catcher assembly).

Figures 13, 15, 16:
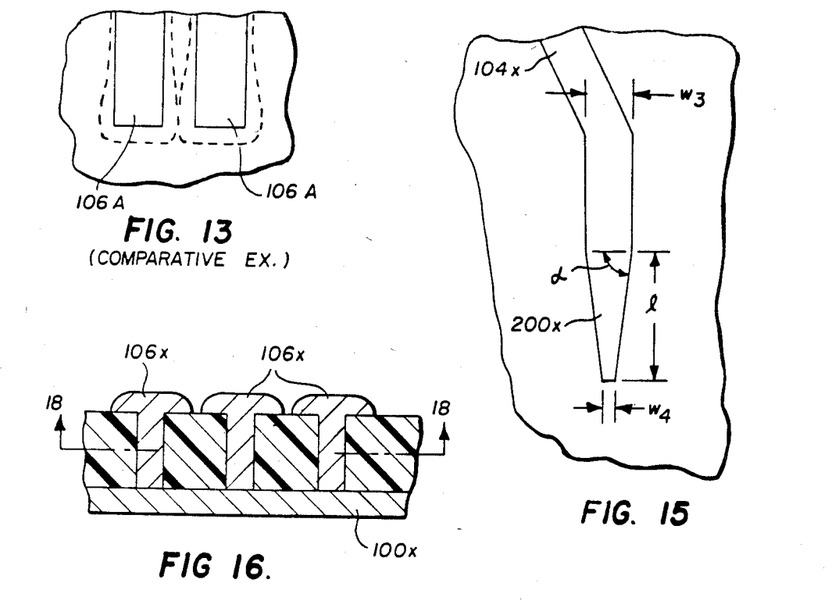
FIG. 13 is a fragmentary enlarged plan view of the electrodes 106A of FIG. 3, but illustrating a comparative example.
FIG. 15 is a fragmentary enlarged plan view of the tapered ends shown in FIG. 14.
FIG. 16 is a section view similar to that of FIG. 2A, but of the results produced by the embodiment of FIG. 14.
Figure 14:
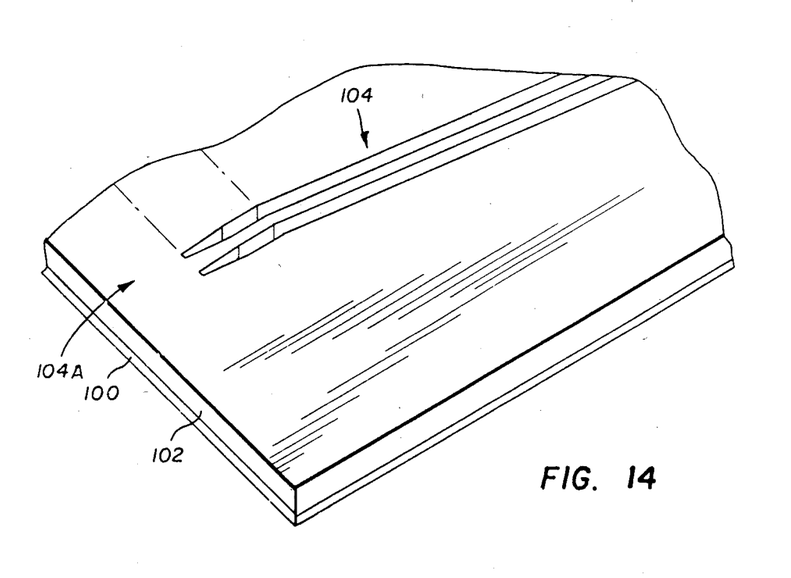
FIG. 14 is an isometric view similar to the view of FIG. 1, but illustrating an alternative embodiment.

Another advantage of this embodiment is that the electroplating step that produces the structure of FIG. 16 can be speeded up by a factor of about 4. For example, the length of time to plate the electrodes 200x of FIG. 16 can be about 90 min.

It will be appreciated from an understanding of the above-described fabrication method of the present invention that the novel molded charge electrode structure formed by that method, as shown, e.g., in FIG. 11, comprises a rugged, high reliability charge plate having high dimensional accuracy and excellent electrical characteristics which is inexpensively and readily fabricated by means of highly accurate photolithographic, plating and molding techniques without any requirement for high precison machining operations. The electrodes 106A and the connecting circuit leads 106B which terminate in connecting points 106C are three dimensional electroformed structures which are embedded into the dielectric substrate 138 and anchored into that substrate by means of internally engaged retaining flanges 106 best seen in FIGS. 9 and 10. Further, the operations performed in accordance with the method of the present invention readily lend themselves to automated fabrication of the novel molded charge plates.

While the method herein described and the form of apparatus constructed in accordance with the method constitute preferred embodiments of this invention, it is to be understood that the invention is not limited to this precise method and form of apparatus and that changes may be made in either without departing from the scope of the invention which is defined in the appended claims.

What is claimed is:

1. A charge electrode structure for use in an ink jet printer comprising:
    a dielectric substrate;
    a plurality of spaced electrodes each having a length effective to charge ink droplets passing thereby, said electrodes being at least partially embedded in their depth dimension within said substrate and being at least partially exposed along their lengths at a first surface of said substrate; and a plurality of electrically conducting circuit leads at least partially embedded in their depth dimension within said substrate and extending lengthwise along a second dimension of said substrate at an angle to said first surface, said circuit leads respectively being electrically connected to said electrodes, said electrodes and said circuit leads having an embedded depth that exceeds the width of individual members of said electrodes and of said circuit leads, measured at said surface and said dimension.

2. A charge electrode structure for use in an ink jet printer comprising:

a dielectric substrate;

a plurality of regularly spaced ink-drop charging electrodes each having a length effective to charge ink droplets passing thereby, said electrodes being at least partially embedded in their depth dimension within said substrate and being at least partially exposed along their lengths at a first surface of said substrate; and a plurality of electrically conducting circuit leads at least partially embedded in their depth dimension within said substrate and extending lengthwise along a second dimension of said substrate at an angle to said first surface, said circuit leads respectively being electrically connected to said electrodes, said electrodes and said circuit leads further including retaining flanges that anchor said electrodes and leads within said substrate.

3. A charge electrode structure as claimed in claim 2, wherein said circuit path length exceeds said electrode length whereby the charge electrodes can be readily electrically connected to said ink jet printer.

4. A charge electrode structure as claimed in claim 1 or 2, wherein said electrodes and circuit leads comprise in cross-section generally parallel sidewalls extending into said substrate.

5. A charge electrode structure as claimed in claim 1 or 2, wherein said dielectric substrate comprises an epoxy resin molded to said electrodes and circuit leads.

6. A charge electrode structure as claimed in claim 5, further comprising sheet means embedded within said molded epoxy resin substrate for reducing the required volume of said epoxy resin and strengthening said substrate.

7. A charge electrode structure as claimed in claim 6, wherein said sheet means comprises a laminated fiberglass epoxy board which includes a layer of electrically conductive material formed thereon and further comprising means for connecting a selected potential to said electrically conductive layer whereby interference between signals conducted on said electrodes and circuit leads is reduced.

8. A charge electrode structure as claimed in claim 6, wherein said sheet means comprises a perforated sheet of stainless steel and further comprising means for connecting a selected potential to said perforated sheet whereby the required volume of said epoxy resin is reduced, said substrate is strengthened and interference between signals conducted on said electrodes and circuit leads is reduced.

9. A charge electrode structure as defined in claim 1, wherein said electrodes are tapered along their length.

10. A method of fabricating a charge electrode structure comprising the steps of:

forming a pattern defining electrode and associated connecting circuit path positions on a substantially planar foil sheet adapted for plating, the remainder of said sheet being protected by a covering and thereby being resistant to plating operations;

plating said pattern with an electrically conducting material to form electrodes and associated connecting circuit leads;

removing said covering from said foil sheet;

bending said foil sheet to form an inside corner in said plated material and an outside corner in said foil sheet such that at least a portion of said electrodes are angularly oriented relative to said circuit leads;

forming a dielectric substrate around said plated material; and removing said foil sheet to expose plated material electrodes and associated connecting circuit leads embedded in the surface of said substrate.

11. A method of fabricating a charge electrode structure as claimed in claim 10, wherein said plating step comprises plating to a thickness exceeding the thickness of said covering such that the plated material extends over the upper surface of said covering to form retaining flanges on each of said electrodes and circuit leads, the lateral extension of said flanges being limited such that no two of said flanges interconnect whereby said electrodes and associating connecting circuit leads are anchored to said substrate by means of said retaining flanges.

12. A method of fabricating a charge electrode structure as claimed in claim 11, further comprising the step of clamping the bent portion of said foil sheet against a substantially flat surface prior to molding said substrate to ensure substantial flatness of the surface of said substrate including said plated material electrodes.

13. A method of fabricating a charge electrode structure as claimed in claim 11 wherein the step of forming a pattern defining electrode and associated connecting circuit path positions comprises the steps of:

laminating a covering to a foil sheet, said covering comprising a photoresistive film material;

exposing the covered side of said sheet to actinic light through a photomask to define said pattern on said covering; and removing the portions of said covering corresponding to said pattern to expose said foil sheet under said pattern.

14. A method of fabricating a charge electrode structure as claimed in claim 11, wherein the step of forming a dielectric substrate comprises the steps of:

placing said foil sheet into a mold with said foil sheet effectively forming two walls of said mold; and molding a dielectric substrate in said mold, said substrate extending to the surface of said foil sheet to surround said plated material including said retaining flanges.

15. A method of fabricating a charge electrode structure as claimed in claim 14, further comprising the steps of:

clamping the portion of said sheet including said circuit leads against the bottom wall of said mold to effectively form said bottom wall and to ensure substantial flatness to the corresponding side of said substrate; and clamping the bent portion of said sheet against a sidewall of said mold to effectively form said sidewall and to ensure substantial flatness of the surface of said substrate including said plated material electrodes.

16. A method of fabricating a charge electrode structure as claimed in claim 15, further comprising the step of placing perforated sheet means over said electrodes prior to forming said electric substrate whereby said perforated sheet means is embedded within and strengthens said substrate.

17. A method of fabricating a charge electrode structure as claimed in claim 15, further comprising the steps of placing a perforated sheet of fiberglass epoxy board having an electrically conductive coating thereon over said electrodes prior to forming said dielectric substrate and providing means for connecting a selected potential to said electrically conductive coating whereby said substrate is strengthened and interference between signals conducted on said electrodes and said circuit leads is reduced.

18. A method of fabricating a charge electrode structure as claimed in claim 15, further comprising the steps of placing a perforated sheet of stainless steel over said electrodes and insulated therefrom prior to forming said dielectric substrate and providing means for connecting a selected potential to said perforated sheet whereby said substrate is strengthened and interference between signals conducted on said electrodes and said circuit leads is reduced.

19. A method of fabricating a charge electrode structure comprising the steps of:
   laminating a photoresistive covering to a copper sheet;
   exposing the covered side of said copper sheet to actinic light through a photomask to impose a pattern defining electrode and associated connecting circuit path positions on said covering;
   developing said covering to remove the portion of said covering corresponding to said pattern and expose said copper sheet under said pattern with the remainder of said covering remaining intact and resistant to plating operations;
   plating said pattern with nickel to form electrodes and associated connecting circuit leads of a thickness exceeding the thickness of said covering such that the nickel extends above and over the upper surface of said covering to form retaining flanges on each of said electrodes and circuit leads, the lateral extension of said flanges being limited such that no two of said flanges interconnect;
   removing the remainder of said photoresistive covering from said foil sheet;
   bending said foil sheet toward said plated material electrodes and circuit leads such that at least a portion of said electrodes are oriented at approximately a 90° angle relative to said circuit leads;
   placing said foil sheet into a mold;
   clamping the portion of said sheet including said circuit leads into said mold to effectively form the bottom surface of said mold and to ensure substantial flatness of that portion of said sheet;
   clamping the portion of said sheet including a portion of said electrodes against a sidewall of said mold to effectively form the sidewall surface of said mold and to ensure substantial flatness of that portion of said sheet;
   injecting a dielectric material into said mold, said epoxy material flowing to the surface of said foil sheet to surround said plated material electrodes and circuit leads including said retaining flanges;
   curing said epoxy material to form a copper clad dielectric substrate having said electrodes and circuit leads embedded therein and anchored thereto; and
   immersing said copper clad dielectric substrate into a copper etchant to remove said copper sheet and thereby expose the plated material electrodes and connecting circuit leads on adjacent surfaces of said substrate.

20. A method of fabricating a charge electrode structure as claimed in claim 19, further comprising the step of placing a perforated sheet of fiberglass epoxy board into said mold prior to injecting an epoxy material into said mold whereby said perforated sheet is embedded within and strengthens said substrate.

21. A method of fabricating a charge electrode structure as claimed in claim 19, further comprising the steps of placing a perforated sheet of fiberglass epoxy board having an electrically conductive coating thereon into said mold prior to injecting an epoxy material into said mold and providing means for connecting a selected potential to said electrically conductive coating whereby said substrate is strengthened and interference between signals conducted on said electrodes and said circuit leads is reduced.

22. A method of fabricating a charge electrode structure as claimed in claim 19, further comprising the steps of placing a perforated sheet of stainless steel insulated from said electrodes into said mold prior to injecting an epoxy material into said mold and providing means for connecting a selected potential to said perforated sheet whereby said substrate is strengthened and interference between signals conducted on said electrodes and said circuit leads is reduced.

23. A method as defined in claim 10, wherein said forming step comprises forming a pattern defining electrode positions having a taper along their lengths for a predetermined distance.

24. A charge electrode structure for use in an ink jet printer comprising:
   a dielectric substrate;
   a plurality of spaced electrodes each having a length effective to charge ink droplets passing thereby, said electrodes being at least partially embedded in their depth dimension within said substrate and being at least partially exposed along their lengths at a first surface of said substrate; and
   a plurality of electrically conducting circuit leads at least partially embedded in their depth dimension within said substrate and extending lengthwise along a second dimension of said substrate at an angle to said first surface, said circuit leads respectively being electrically connected to said electrodes,
   said electrodes having an embedded depth that exceeds the width of individual members of said electrodes, measured at said surface,
   said electrodes and said leads further including retaining flanges that anchor said electrodes and said leads within said substrate.

* * * * *

UNITED STATES PATENT AND TRADEMARK OFFICE
CERTIFICATE OF CORRECTION

PATENT NO. : 4,560,991
DATED : December 24, 1985
INVENTOR(S) : Schutrum

It is certified that error appears in the above-identified patent and that said Letters Patent are hereby corrected as shown below:

In the heading of the patent, category [56], after "U.S. Patent Documents", insert:

3,152,938    10/64    Osifichin et al
                                        430/315

Signed and Sealed this

Fifth Day of April, 1988

*Attest:*

DONALD J. QUIGG

*Attesting Officer*        *Commissioner of Patents and Trademarks*